US011963398B2

(12) United States Patent
Yang (10) Patent No.: US 11,963,398 B2
(45) Date of Patent: Apr. 16, 2024

(54) DISPLAY PANEL AND DISPLAY DEVICE (71) Applicant: Wuhan China Star Optoelectronics Semiconductor Display Technology Co., Ltd., Hubei (CN)

(72) Inventor: Cheng Yang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 567 days.

(21) Appl. No.: 17/287,170

(22) PCT Filed: Feb. 26, 2021

(86) PCT No.: PCT/CN2021/078086
§ 371 (c)(1),
(2) Date: Apr. 21, 2021

(87) PCT Pub. No.: WO2022/156039
PCT Pub. Date: Jul. 28, 2022

(65) Prior Publication Data
US 2023/0157070 A1    May 18, 2023

(30) Foreign Application Priority Data
Jan. 21, 2021  (CN) .......................... 202110081827.X (51) Int. Cl.
*H10K 59/121*    (2023.01)
(52) U.S. Cl.
CPC ................................ *H10K 59/1213* (2023.02)

(58) Field of Classification Search
CPC .. H10K 59/122; H10K 59/88; H10K 59/1213; H10K 50/814; H10K 50/824; H10K 59/121; H01L 27/124
See application file for complete search history.

(56) References Cited

U.S. PATENT DOCUMENTS

| | | | |
|---|---|---|---|
| 2005/0127358 A1* | 6/2005 | Kawamura | ........... H01L 27/124 257/E27.111 |
| 2012/0268002 A1* | 10/2012 | Osako | ................. H10K 59/122 313/504 |
| 2018/0374909 A1* | 12/2018 | Nishikiori | ............ H10K 59/122 |
| 2019/0198557 A1 | 6/2019 | Yang | |
| 2021/0210584 A1* | 7/2021 | Youn | ..................... H10K 59/88 |

FOREIGN PATENT DOCUMENTS

| | | |
|---|---|---|
| CN | 102035533 | 4/2011 |
| CN | 109817644 | 5/2019 |
| CN | 109873002 | 6/2019 |

(Continued)

*Primary Examiner* — Jaehwan Oh (57) ABSTRACT

The present disclosure provides a display panel and a display device. The display panel includes a plurality of auxiliary pixel driving circuits. Each of the auxiliary pixel driving circuits includes transistors, and each of the transistors includes an active layer and an insulation layer. The display panel is defined with first dummy holes in a transition display area, and the first dummy holes penetrate a part of the insulation layer away from the active layer in order to reduce difference in electrical properties between the auxiliary pixel driving circuits through the first dummy holes, thereby achieving display uniformity of the display panel.

17 Claims, 7 Drawing Sheets

(56) References Cited

FOREIGN PATENT DOCUMENTS

| | | |
|---|---|---|
| CN | 110504287 | 11/2019 |
| CN | 111028692 | 4/2020 |
| CN | 111554693 | 8/2020 |
| CN | 112102783 | 12/2020 |
| KR | 10-2005-0028567 | 3/2005 |
| KR | 10-2015-0021408 | 3/2015 |
| WO | WO 2008/081614 | 7/2008 |

* cited by examiner

| Area I | Area II | Area III | Mura | W255 | W32 |
|---|---|---|---|---|---|
| None | None | First dummy holes densely arranged | Yes |  |  |
| First dummy holes and vias arranged in 3 rows | First dummy holes densely arranged>4rows | First dummy holes densely arranged | None |  |  |
| | First dummy holes densely arranged>4 rows | First dummy holes densely arranged | None | | |
| | First dummy holes densely arranged>4rows+3 rows of third dummy holes | First dummy holes densely arranged | None | | |

Table 1

FIG. 5

DISPLAY PANEL AND DISPLAY DEVICE

RELATED APPLICATIONS

This application is a National Phase of PCT Patent Application No. PCT/CN2021/078086 having International filing date of Feb. 26, 2021, which claims the benefit of priority of Chinese Patent Application No. 202110081827.X filed on Jan. 21, 2021. The contents of the above applications are all incorporated by reference as if fully set forth herein in their entirety.

FIELD AND BACKGROUND OF THE INVENTION

The present disclosure relates to the field of display technology, specifically to a display panel and a display device.

A camera under panel (CUP) technology is adopted in a display panel, which can take into account an imaging effect of a camera and a full-screen display design. However, a driving circuit that drives pixels in a CUP area to emit light is disposed at a periphery of the CUP area. Differences in density of driving circuit layout and difference in electrical properties of transistors adopted in each driving circuit will cause pixels in the CUP area to have differences in brightness when receiving a same driving signal, which causes uneven display in the CUP area.

SUMMARY OF THE INVENTION

An embodiment of the present disclosure provides a display panel, wherein the display panel comprises a display transmission area and a transition display area around the display transmission area, and the display panel comprises a plurality of auxiliary pixel driving circuits and a plurality of auxiliary sub-pixels. The plurality of auxiliary pixel driving circuits are located in the transition display area, and the plurality of auxiliary sub-pixels are located in the display transmission area and electrically connected to the auxiliary pixel driving circuits. Each of the plurality of auxiliary pixel driving circuits comprises transistors, and each of the transistors comprises an active layer and an insulation layer on the active layer.

Wherein the display panel is defined with first dummy holes in the transition display area, and the first dummy holes penetrate parts of the insulation layer away from the active layer.

In some embodiments, the display panel further comprises a plurality of pixel circuit driving islands located in the transition display area, wherein each of the pixel circuit driving islands comprises the plurality of auxiliary pixel driving circuits, the first dummy holes comprise a plurality of first sub-dummy holes, and each of the first sub-dummy holes is located between two adjacent pixel circuit driving islands.

In some embodiments, each of the pixel circuit driving islands has a length direction, each of the auxiliary pixel driving circuits has a first length in the length direction, and the plurality of first sub-dummy holes between two adjacent pixel circuit driving islands have a second length; wherein the second length is greater than the first length, the second length is equal to a distance between the first sub-dummy hole at a beginning end and the first sub-dummy hole at a terminal end among the plurality of first sub-dummy holes in the length direction.

In some embodiments, the second length is greater than or equal to two times of the first length.

In some embodiments, the first dummy holes comprise a plurality of second sub-dummy holes located at side of the pixel circuit driving islands close to the display transmission area.

In some embodiments, a number of column and/or row of the plurality of second sub-dummy holes is greater than or equal to 4.

In some embodiments, the display panel further comprises a main display area located at a side of the transition display area away from the display transmission area, and the first dummy holes comprise a plurality of third sub-dummy holes located at side of the pixel circuit driving islands close to the main display area.

In some embodiments, the display panel further comprises a plurality of main sub-pixels and a plurality of main pixel driving circuits driving the plurality of main sub-pixels in the main display area; wherein each of the main pixel driving circuits has a plurality of vias, and from a top view, an arrangement manner of the plurality of first dummy holes is same as an arrangement manner of the plurality of vias, or the plurality of first dummy holes is arranged in matrix.

In some embodiments, the display panel is further defined with second dummy holes in the transition display area, the second dummy holes are located at sides of the pixel circuit driving islands close to the display transmission area, the second dummy holes penetrate the insulation layer, and aperture diameters of the second dummy holes are greater than aperture diameters of the first dummy holes.

In some embodiments, the display panel further comprises third dummy holes located in the transition display area, the third dummy holes penetrate the insulation layer, and depths of the third dummy holes are greater than or equal to depths of the first dummy holes.

In some embodiments, each of the transistors further comprises a first insulation layer, a first electrode layer, a second insulation layer, and a second electrode layer.

The first insulation layer is located on the active layer; the first electrode layer is located on the first insulation layer, wherein the first electrode layer comprises a first wire portion and a first electrode portion facing the active layer; the second insulation layer is located on the first electrode layer; and the second electrode layer is located on the second insulation layer, wherein the second electrode layer comprises a second wire portion and a second electrode portion electrically connected to the active layer.

Wherein the insulation layer comprises a first insulation layer and a second insulation layer, and the first dummy holes do not penetrate the active layer, the first electrode layer, and the second electrode layer.

In some embodiments, the display panel further comprises a planarization layer at a side of the insulation layer away from the active layer, and the planarization layer comprises a filling portion located in the first dummy holes.

In some embodiments, aperture diameters of the first dummy holes are greater than or equal to 2 um and less than or equal to 3.5 um, and a distance between two adjacent dummy holes is greater than or equal to 2 um and less than or equal to 5 um.

In some embodiments, aperture diameters of the second dummy holes are greater than or equal to 4 um and less than or equal to 7 um, and a difference between the aperture diameters of the second dummy holes and the first dummy holes is greater than or equal to 1 um and less than or equal to 4.5 um.

In some embodiments, the plurality of auxiliary sub-pixels comprise organic light-emitting diodes, micro light-emitting diodes and sub-millimeter light-emitting diodes.

In some embodiments, the first dummy holes are prepared after dehydrogenation treatment.

An embodiment of the present disclosure further provides a display device, wherein the display device comprises any one of the above display panels.

Compared to the prior art, the embodiment of the present disclosure provides a display panel and display device. The display panel comprises a display transmission area and a transition display area around the display transmission area, and the display panel comprises a plurality of auxiliary pixel driving circuits and a plurality of auxiliary sub-pixels. The plurality of auxiliary pixel driving circuits are located in the transition display area, and the plurality of auxiliary sub-pixels are located in the display transmission area and electrically connected to the auxiliary pixel driving circuits. Each of the plurality of auxiliary pixel driving circuits comprises transistors, and each of the transistors comprises an active layer and an insulation layer on the active layer. Wherein the display panel is defined with first dummy holes in the transition display area, and the first dummy holes penetrate parts of the insulation layer away from the active layer, in order to reduce difference in electrical properties occurring between the plurality of auxiliary pixel driving circuits through the first dummy holes and improve electrical uniformity of the auxiliary pixel driving circuits, thereby achieving display uniformity of the display panel.

DESCRIPTION OF SPECIFIC EMBODIMENTS OF THE INVENTION

In order to make purpose, technical solution and effect of the present disclosure more clearly and completely, the present disclosure will be described in detail below with reference to drawings and embodiments. It should be understood that specific embodiments described here are merely used to explain the present disclosure, and not used to limit the present disclosure.

Figure 1A:
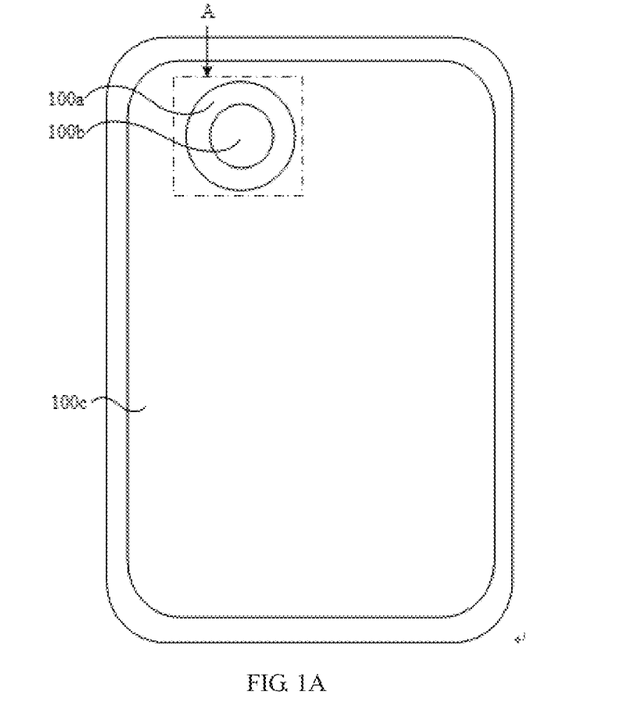
FIGS. 1A, 1B and 1C are schematic structural diagrams of a display panel provided by an embodiment of the present disclosure.
Figure 1B:
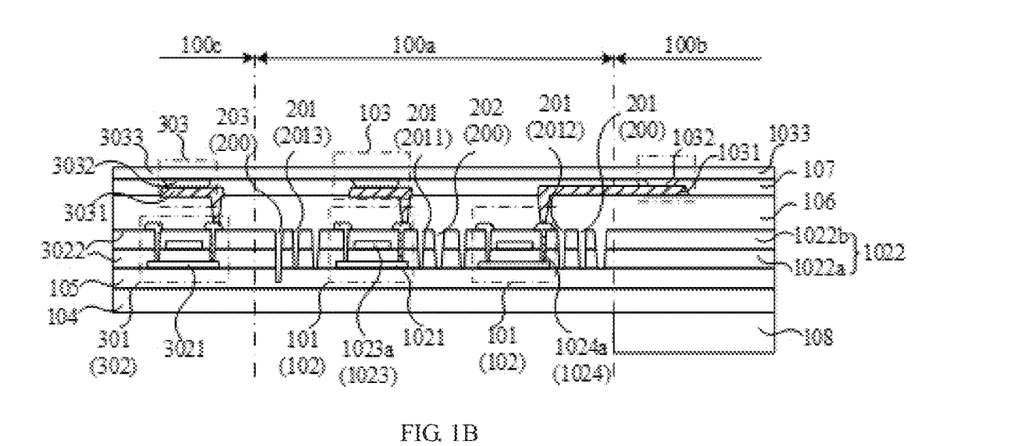
Figure 1C:
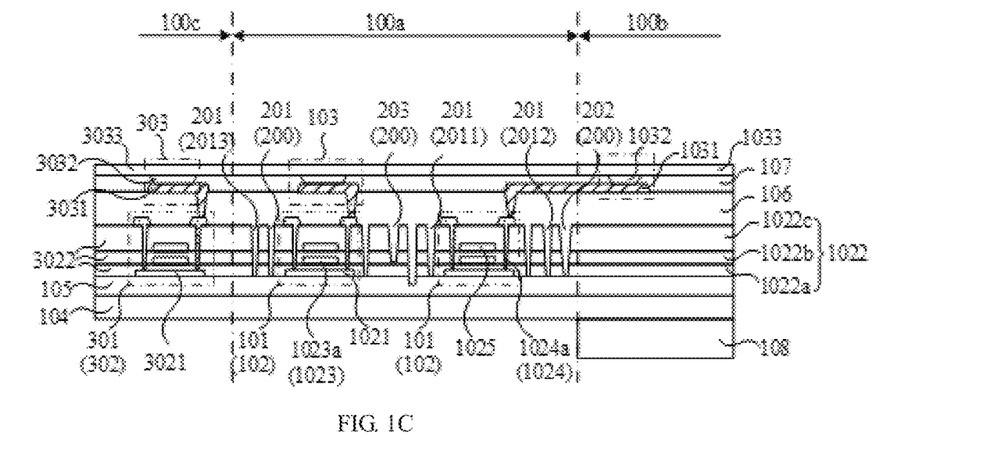
Figure 1D:
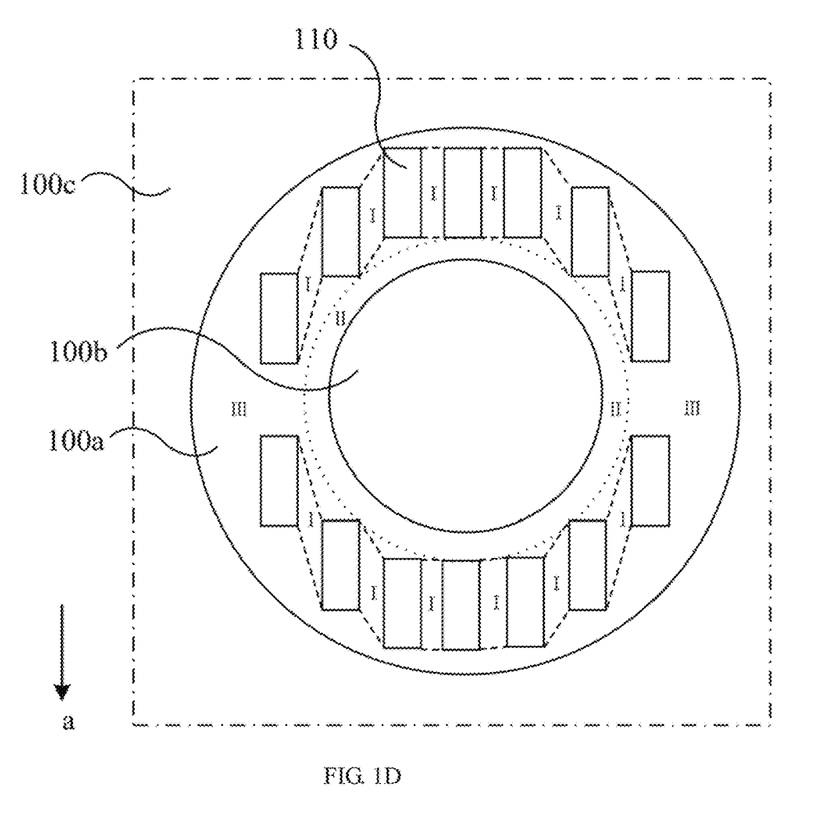
FIG. 1D is a partially enlarged diagram of A in FIG. 1A.

Specifically, please refer to FIGS. 1A-1C, which are schematic structural diagrams of a display panel provided by an embodiment of the present disclosure. As shown in FIG. 1D, FIG. 1D is a partially enlarged diagram of A in FIG. 1A.

An embodiment of the present disclosure provides a display panel. The display panel comprises a display transmission area 100b and a transition display area 100a around the display transmission area 100b. The display panel comprises a plurality of auxiliary pixel driving circuits 101 and a plurality of auxiliary sub-pixels 103. The plurality of auxiliary pixel driving circuits 101 are located in the transition display area 100a, the plurality of auxiliary sub-pixels 103 are located in the transition display area 100a and the display transmission area 100b, and the auxiliary pixel driving circuits 101 are electrically connected to the auxiliary sub-pixels 103 and configured to drive at least one of the auxiliary sub-pixels 103 to emit light.

Alternatively, the display panel comprises a self-luminous display panel, and the auxiliary sub-pixels 103 comprise at least one of organic light-emitting diodes, micro light-emitting diodes, or submillimeter light-emitting diodes.

Each of the auxiliary pixel driving circuits 101 comprises a plurality of transistors 102, and each of the transistors 102 comprises an active layer 1021 and an insulation layer 1022 on the active layer 1021.

Wherein, the display panel is defined with a plurality of dummy holes 200 in the transition display area 100a, and the dummy holes 200 penetrate parts of the insulation layer 1022 away from the active layer 1021, in order to improve electrical uniformity of the auxiliary pixel driving circuits 101 through the dummy holes 200, thereby achieving display uniformity of the display panel.

Alternatively, the transistors 102 are current driven devices. In addition, the transistors 102 comprise thin film transistors. The active layer 1021 comprises a silicon active layer. In addition, the active layer 1021 comprises a low temperature poly silicon active layer. The transistors 102 comprise P-type transistors and N-type transistors.

Since a defect density at an interface between the active layer 1021 and the insulation layer 1022 will affect electrical properties of the transistors 102 such as threshold voltages and sub-threshold swings, when the transistors 102 are current-driven devices, the greater absolute values of the threshold voltages of the transistors 102, the greater the sub-threshold swings of the transistors 102, and the less influence of fluctuations of gate-source voltages of the transistors 102 have on current flowing through sources and drains of the transistors 102, so that the transistors 102 can provide more stable driving current to the auxiliary sub-pixels 103, thereby further reducing fluctuations in luminance of the auxiliary sub-pixels 103, which helps to improve display uniformity of the display panel.

By setting the dummy holes 200 in the transition display area 100a, the defect density at the interface of the active layer 1021 and the insulation layer 1022 can be increased, and therefore the sub-threshold swings of the transistors 102 are increased, and the influence of the fluctuations of the gate-source voltages of the transistors 102 on the current flowing through the sources and the drains of the transistor 102 is reduced, thereby preventing the problem of uneven display of the display panel, which is caused by driving current driving the auxiliary sub-pixels 103 to emit light being sensitive to the fluctuations of the gate-source voltages of the transistors 102 due to less sub-threshold swings of the transistors 102 when the display panel adopts low gray level driving.

Specifically, please continue to refer to FIGS. 1B-1C. The plurality of dummy holes comprise first dummy holes 201, second dummy holes 202, and third dummy holes 203. Wherein, the first dummy holes 201 penetrate a part of the insulation layer 1022 away from the active layer 1021, and the second dummy holes 202 and the third dummy holes 203 penetrate the insulation layer 1022. Alternatively, from a top view, a shape of the dummy holes 200 may be rectangle, circle, diamond, oval, etc.

In addition, an aperture diameter of the first dummy holes 201 is different from an aperture diameter of the second dummy holes 202. Moreover, the aperture diameter of the second dummy holes 202 is greater than the aperture diameter of the first dummy holes 201. Specifically, the aperture diameter of the first dummy holes 201 is greater than or equal to 2 um and less than or equal to 3.5 um. The aperture diameter of the second dummy holes 202 is greater than or equal to 4 um and less than or equal to 7 um, and a difference between the aperture diameters of the first dummy holes 201 and the second dummy holes 202 is greater than or equal to 1 um and less than or equal to 4.5 um. In addition, the aperture diameter of the first dummy holes 201 is greater than or equal to 2.5 um and less than or equal to 3 um.

Further, a depth of the first dummy holes 201 is different from a depth of the third dummy holes 203. In addition, the depth of the third dummy holes 203 is greater than or less than the depth of the first dummy holes 201. Specifically, the first dummy holes 201 completely penetrate the insulation layer 1022, the third dummy holes 203 partially penetrate the insulation layer 1022, or the third dummy holes 203 completely penetrate the insulation layer 1022.

Please continue to refer to FIGS. 1B-1C. The insulation layer 2011 comprises a first insulation layer 1022a and a second insulation layer 1022b. Wherein, the first insulation layer 1022a is located on the active layer 1021, and the second insulation layer 1022b is located at a side of the first insulation layer 1022a away from the active layer 1021. The depth of the first dummy holes 201 is equal to a sum of thicknesses of the first insulation layer 1022a and the second insulation layer 1022b.

In addition, the transistor 102 further comprises a first electrode layer 1023 and a second electrode layer 1024. Wherein, the first electrode layer 1023 is located on the first insulation layer 1022a, and the first electrode layer 1023 comprises a first wire portion and a first electrode portion 1023a disposed corresponding to the active layer 1021. The second electrode layer 1024 is located on the second insulation layer 1022b, and the second electrode layer 1024 comprises a second wire portion and a second electrode portion 1024a electrically connected to the active layer 1021.

The dummy holes 200 do not penetrate the active layer 1021, the first electrode layer 1023, and the second electrode layer 1024, in order to ensure that a connection structure of the auxiliary pixel driving circuits 101 will not be affected by the dummy holes 200. Specifically, the first dummy holes 201 do not penetrate the active layer 1021, the first electrode layer 1023, and the second electrode layer 1024.

In addition, please continue to refer to FIG. 1C. The transistor 102 further comprises a third electrode layer 1025 and a third insulation layer 1022c. The third insulation layer 1022c is located on the third electrode layer 1025, and the third electrode layer 1025 and the third insulation layer 1022c are located between the second insulation layer 1022b and the second electrode layer 1024. Wherein, the dummy holes 200 do not penetrate the first electrode layer 1023, the second electrode layer 1024, and the third electrode layer 1025. The depth of the first dummy holes 201 is equal to a sum of thicknesses of the first insulation layer 1022a, the second insulation layer 1022b, and the third insulation layer 1022c.

In addition, the display panel further comprises a substrate 104 and a buffer layer 105. The buffer layer 105 is located between the substrate 104 and the active layer 1021. The third dummy holes 203 penetrate the buffer layer 105, so that the depth of the third dummy holes 203 is greater than the depth of the first dummy holes 201, or the third dummy holes 203 partially penetrate the insulation layer 1022, so that the depth of the third dummy holes 203 is less than the depths of the first dummy holes 201.

Alternatively, the substrate comprises a flexible substrate and a rigid substrate.

Since the first dummy holes 201 completely penetrate the insulation layer 1022, the defect density at the interface of the active layer 1021 and the insulation layer 1022 can be increased by setting a density of the first dummy holes 201.

Figure 1E:
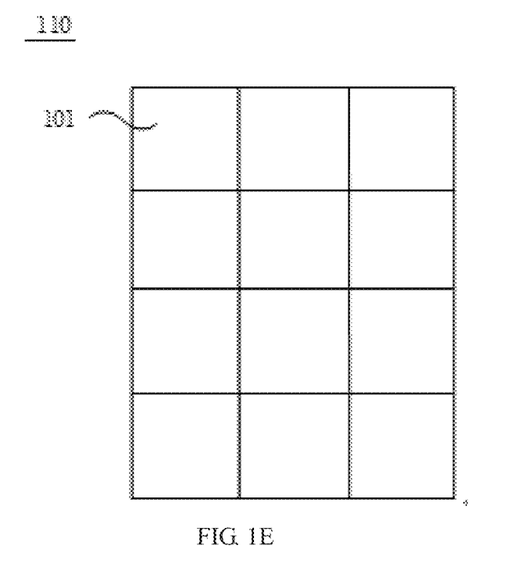
FIG. 1E is a schematic structural diagram of a pixel circuit driving island provided by an embodiment of the present disclosure.
Figure 1F:
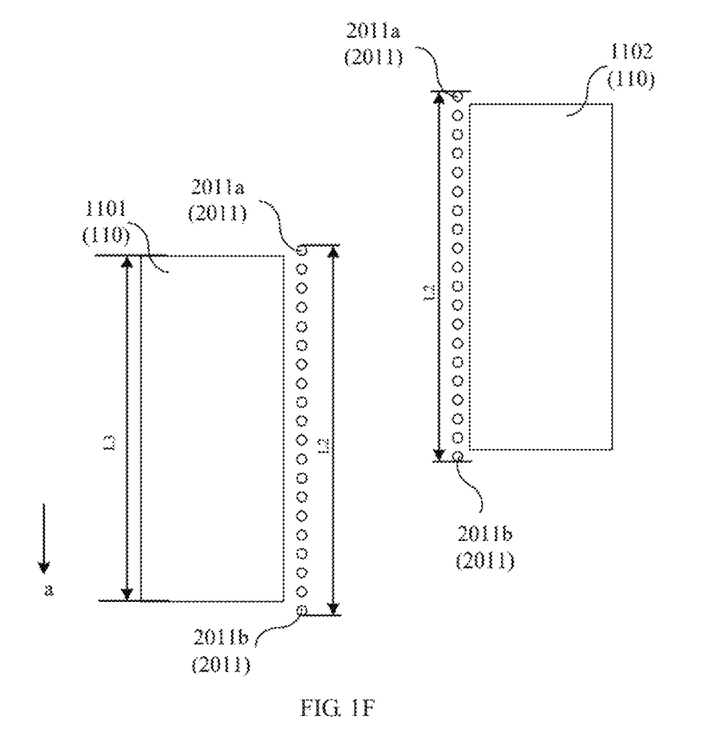
FIGS. 1F-1G are schematic structural diagrams of first sub-dummy holes and the pixel circuit driving island provided by an embodiment of the present disclosure.
Figure 1G:
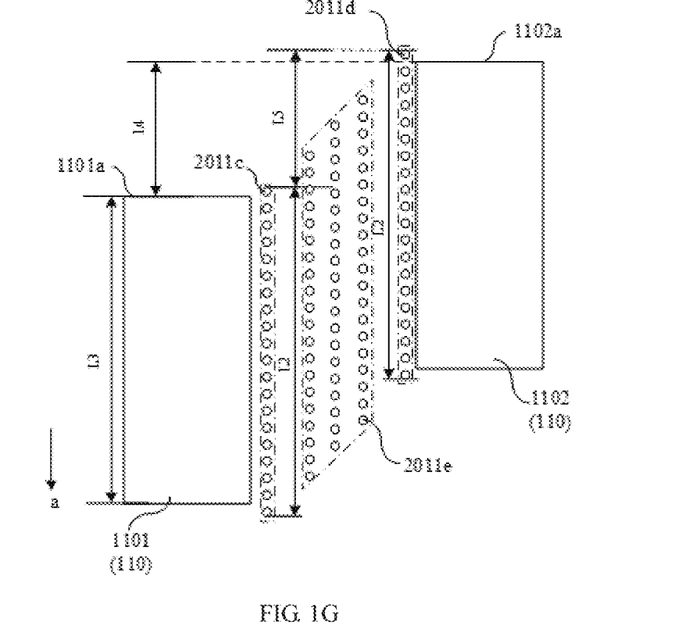
Figure 1H:
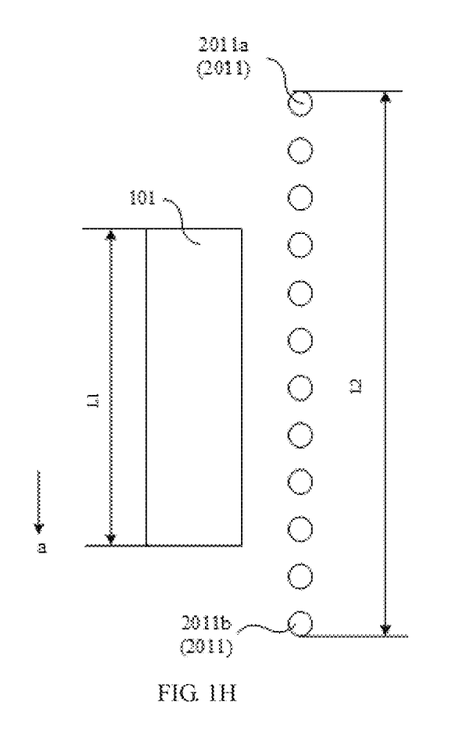
FIG. 1H is a schematic structural diagram of the first sub-dummy holes and an auxiliary pixel driving circuit provided by an embodiment of the present disclosure.

Specifically, as shown in FIG. 1E, FIG. 1E is a schematic structural diagram of a pixel circuit driving island provided by an embodiment of the present disclosure. As shown in FIGS. 1F to 1G, FIGS. 1F-1G are schematic structural diagrams of first sub-dummy holes and the pixel circuit driving island provided by the embodiment of the present disclosure. As shown in FIG. 1H, FIG. 1H is a schematic structural diagram of the first sub-dummy holes and an auxiliary pixel driving circuit provided by an embodiment of the present disclosure.

Please continue to refer to FIGS. 1D-1H. The display panel further comprises a plurality of pixel circuit driving islands 110. The pixel circuit driving islands 110 are located in the transition display area 100a, and each of the pixel circuit driving islands comprises a plurality of auxiliary pixel driving circuits 101. The first dummy holes 201 comprise a plurality of first sub-dummy holes 2011, and each of the first sub-dummy holes 2011 is located between two adjacent pixel circuit driving islands 110, i.e., the first sub-dummy holes 2011 are located in area I in FIG. 1D.

Since the pixel circuit driving islands 110 comprise the auxiliary pixel driving circuits 101, and the auxiliary pixel driving circuits 101 comprise the transistors 102, the plurality of first sub-dummy holes 2011 are disposed between two adjacent pixel circuit driving islands 110, so that the first sub-dummy holes 2011 are closer to the active layer 1021 of the transistors 102, which is conducive to improving electrical uniformity of the sub-pixel driving circuits 101 through the dummy holes 200.

It can be understood that if a layout space allows, two adjacent auxiliary pixel driving circuits 101 in a same pixel circuit driving island 110 may also comprise the plurality of first sub-dummy holes 2011.

Please continue to refer to FIGS. 1D and 1F-1H. Each of the pixel circuit driving islands 110 has a length direction a, each of the auxiliary pixel driving circuits 101 has a first length L1 in the length direction a, and the plurality of first sub-dummy holes 2011 between two adjacent pixel circuit driving islands have a second length L2. Wherein, the second length L2 is greater than the first length L1, and the second length L2 is equal to a distance between the first sub-dummy hole at a beginning end and the first sub-dummy hole at a terminal end of the plurality of first sub-dummy holes 2011 in the length direction a.

Specifically, please continue to refer to FIG. 1H. The plurality of first sub-dummy holes 2011 comprise a front sub-dummy hole 2011a and an end sub-dummy hole 2011b. Each of the auxiliary pixel driving circuits 101 has the first length L1 in the length direction a and the second length L2 from the front sub-dummy hole 2011a to the end sub-dummy hole 2011b in the length direction a (i.e., the second length L2 is equal to a sum of aperture diameters of the first sub-dummy holes 2011 and aperture distances between two adjacent first sub-dummy holes 2011). The second length L2 is greater than the first length L1, so that the plurality of first sub-dummy holes 2011 adjacent to the auxiliary pixel driving circuit 101 can achieve the purpose of improving electrical properties of the transistors 102.

In addition, the second length L2 is greater than or equal to two times the first length L1, so that a length of the first sub-dummy hole 2011s (i.e., the second length L2) is greater than or equal to two times a length of the auxiliary pixel driving circuit 101 (i.e., two times the first length L1), in order to improve electrical uniformity of the auxiliary pixel driving circuit 101.

Specifically, taking the first length L1 of the auxiliary pixel driving circuit 101 being equal to 60 um as an example for description, the second length L2 is greater than or equal to 120 um.

Moreover, please continue to refer to FIG. 1F. The pixel circuit driving island 110 has a third length L3 in the length direction a, and the second length L2 is greater than or equal to the third length L3. Further, from a top view, at least one of the two adjacent pixel circuit driving islands 110 is located between the first sub-dummy hole at the beginning end and the first sub-dummy hole at the terminal end of the first sub-dummy holes 2011. Specifically, please continue to refer to FIG. 1F. The pixel circuit driving island 110 comprises a first pixel circuit driving island 1101 and a second pixel circuit driving island 1102. From the top view, the front sub-dummy hole 2011a and the end sub-dummy hole 2011b of the plurality of first sub-dummy holes 2011 adjacent to the first pixel circuit driving island 1101 are located at two sides of the first pixel circuit driving island 1101. The front sub-dummy hole 2011a and the end sub-dummy hole 2011b in the plurality of the first sub-dummy holes 2011 adjacent to the second pixel circuit driving island 1102 is located at two sides of the second pixel driving island 1102.

In addition, when two adjacent pixel circuit driving islands 110 are not on a same horizontal line, positions of the plurality of first sub-dummy holes 2011 may be designed according to a position of the pixel circuit driving island 110 adjacent thereto. Specifically, as shown in FIG. 1G, the pixel circuit driving island 110 comprises a first pixel circuit driving island 1101 and a second pixel circuit driving island 1102, and the plurality of first sub-dummy holes 2011 are located between the first pixel circuit driving island 1101 and the second pixel circuit driving island 1102. Wherein, from the top view, the first pixel circuit driving island 1101 and the second pixel circuit driving island 1102 are obliquely and parallelly disposed. The plurality of first sub-dummy holes 2011 comprise a plurality of first holes 2011c adjacent to the first pixel circuit driving island 1101 and a plurality of second holes 2011d adjacent to the second pixel driving island 1102, and the plurality of first holes 2011c and the plurality of second holes 2011d are obliquely and parallelly disposed.

In addition, from the top view, a first side 1101a of the first pixel circuit driving island 1101 and an extend line of a first side 1102a of the second pixel circuit driving island 1102 has a fourth length L4 in the length direction a. The plurality of first holes 2011c comprise a first front hole and a first end hole at two ends, and the plurality of second holes 2011d comprise a second front hole and a second end hole at two ends. A first side of the first front hole and a first side of the second front hole have a fifth length L5 in the length direction a. Wherein, the fourth length L4 may be equal to the fifth length L5.

Further, the plurality of first sub-dummy holes 2011 further comprise a plurality of third holes 2011e between the first holes 2011c and the second holes 2011d. Wherein, a number of column of the third holes 2011e is greater than or equal to 1. In a direction from the first holes 2011c to the second holes 2011d, the first holes 2011c, the third holes 2011e, and the second holes 2011d are arranged in an ascending or descending order.

Please continue to refer to FIGS. 1A-1D. The first dummy holes 201 further comprise a plurality of second sub-dummy holes 2012. Wherein, the second sub-dummy holes 2012 are located at sides of the pixel circuit driving islands 110 close to the display transmission area 100b, that is, the second sub-dummy holes are located in area II of FIG. 1D.

In addition, a number of column or row of the plurality of sub-dummy holes 2012 is greater than or equal to 4, so that the plurality of first sub-dummy holes 2011 disposed at a side of the transition display area close to the display transmission area 100b can achieve the purpose of improving electrical properties of the transistors 102.

Please continue to refer to FIGS. 1A-1D. The display panel further comprises a main display area 100c, and the main display area 100c is located at a side of the transition display area 100a away from the display transmission area 100b.

The display panel comprises a plurality of main sub-pixels 303 and a main pixel driving circuit 301 driving the plurality of main sub-pixels 303 to emit light located in the main display area 100c. The first dummy holes 201 further comprise a plurality of third sub-dummy holes 2013. The third sub-dummy holes are located at sides of the pixel circuit driving islands 110 close to the main display area 100c, i.e., the third sub-dummy holes 2013 are located in area III in FIG. 1D.

Alternatively, the main sub-pixels 303 comprise at least one of organic light-emitting diodes, micro light-emitting diodes, or sub-millimeter light-emitting diodes.

Please continue to refer to FIGS. 1B-1C. The main pixel driving circuit 301 comprises a plurality of main transistors 302. Each of the main transistors 302 comprises a main active layer 3021, a main insulation layer 3022 covering the main active layer 3021, and a gate layer and a source-drain layer located at a side of the main insulation layer 3022 away from the main active layer 3021. Wherein, the source-drain layer comprises a first wire, and a source and a drain electrically connected to the main active layer 3021 through first vias in the main insulation layer 3022. The gate layer comprises a second wire and a main gate disposed corresponding to the main active layer 3021. The first wire and the second wire are electrically connected to the source, drain or the main gate of the main transistor 3021 through second vias in the main insulation layer 3022, respectively. In addition, the gate layer, and the source-drain layer may both comprise multiple layers. The main transistor 302 may further comprise a wire layer, and the wire layer is electrically connected to at least one of the first wire or the second wire through the second vias.

Alternatively, the main insulation layer 3022 is in a same layer as the insulation layer 1022, the main active layer 3021 is in a same layer as the active layer 1021, the source-drain layer is in a same layer as the second electrode layer 1024, and the gate layer is in the same layer as the first electrode layer 1023, thereby saving process steps. The main active layer 3021 comprises a silicon active layer and an oxide active layer. The main transistors 302 comprise P-type transistors and N-type transistors. The main transistors 302 comprise field effect transistors. In addition, the main transistors 302 comprise thin film transistors.

Figure 2A:
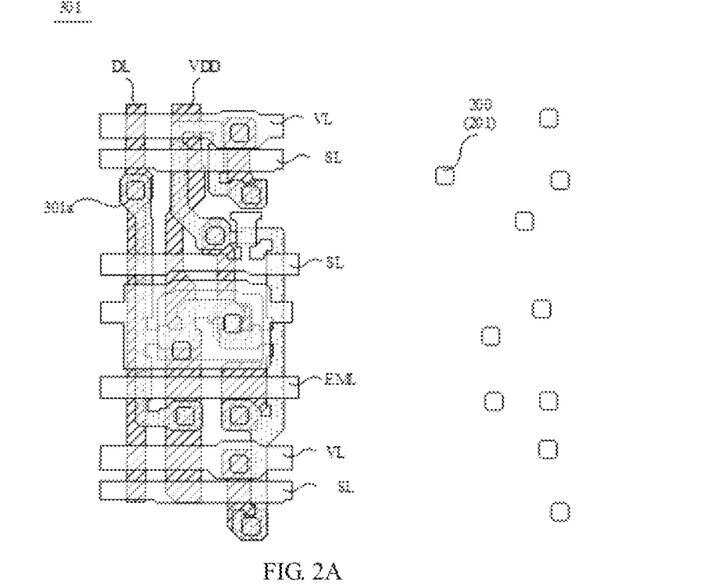
FIGS. 2A, 2B and 2C are schematic layout diagrams of dummy holes provided by an embodiment of the present disclosure.
Figure 2B:
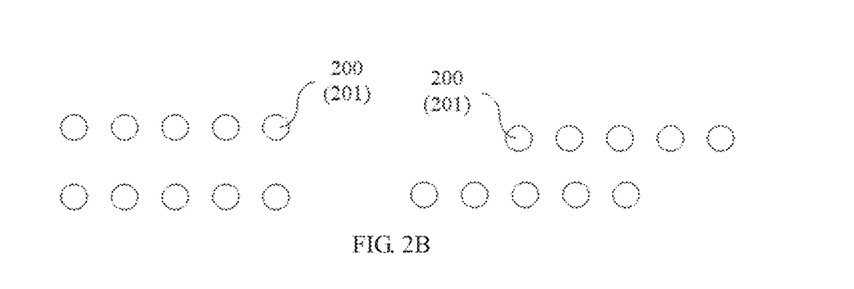
Figure 2C:
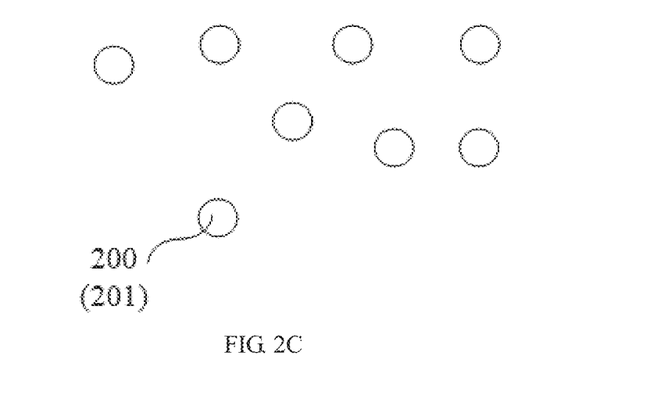

As shown in FIGS. 2A-2C, which are schematic layout diagrams of dummy holes 200 provided by an embodiment of the present disclosure. The main pixel driving circuit 301 comprises a plurality of vias 301a. from the top view, an arrangement manner of the plurality of dummy holes 200 is same as an arrangement manner of the plurality of vias 301a. As shown in FIG. 2A, the plurality of dummy holes 200 are arranged in a matrix, or the plurality of dummy holes 200 are arranged in a parallelogram, as shown in FIG. 2B. Wherein, the vias 301a comprise source-drain vias (i.e., the first vias) and wire vias (i.e., the second vias). According to different structures of the main pixel driving circuit 301, the arrangements of the plurality of vias 301a are also different, as shown in FIG. 2A and FIG. 2C.

Wherein, when the plurality of dummy holes 200 are arranged in the arrangement manner as shown in FIG. 2B, a distance between two adjacent dummy holes 200 is greater than or equal to 2 um and less than or equal to 5 um. In addition, the distance between the two adjacent dummy holes 200 is greater than or equal to 3 um and less than or equal to 4 um.

In addition, an arrangement manner of the plurality of first dummy holes 201 is same as the arrangement manner of the plurality of vias 301a, or the plurality of first dummy holes 201 are arranged in a matrix, or the plurality of first dummy holes 201 are arranged in parallelogram.

Specifically, as shown in FIG. 2A, description will be made assuming that the main pixel driving circuit 301 adopting a 7T1C structure (i.e., the main pixel driving circuit 301 comprises seven main transistors 302, a storage capacitor, and the main pixel driving circuit is connected to a scan line SL, a data line DL, a source line VDD, a light-emitting control line EML, and a reset line VL). The main pixel driving circuit 301 comprises a plurality of vias 301a, from the top view, the arrangement manner of the plurality of first dummy holes 201 is the same as the arrangement manner of the plurality of vias 301a.

Please continue to refer to FIG. 1B-FIG. 1C. The display panel further comprises a planarization layer 106. The planarization layer 106 is located at a side of the insulation layer 1022 away from the active layer 1021. The planarization layer 106 comprises a filling portion located in the first dummy holes 201, the second dummy holes 202, and the third dummy holes 203.

The auxiliary sub-pixel 103 comprises a first anode 1031 electrically connected to the auxiliary pixel driving circuit 101, a first light-emitting layer 1032 located on the first anode 1031, and a cathode 1033 located on the first light-emitting layer 1032.

Alternatively, the first anodes 1031 of the plurality of auxiliary sub-pixels 103 may be electrically connected to a same auxiliary pixel driving circuit 101, so that one auxiliary pixel driving circuit 101 drives the plurality of auxiliary sub-pixels to emit light.

The main sub-pixel 303 comprises a second anode 3031 electrically connected to the main pixel driving circuit 301, a second light-emitting layer 3032 on the second anode 3031, and a second cathode 3033 on the second light-emitting layer 3032.

The display panel further comprises a pixel defining layer 107 located on the first anodes 1031 and the second anodes 3031. The pixel defining layer 107 comprises a plurality of pixel defining areas, and the first light-emitting layers 1032 and the second light-emitting layers 3032 are located in the pixel defining areas.

In addition, a transmittance rate of the display transmission area 100b is greater than a transmittance rate of the main display area 100c. The display panel further comprises a sensor 108, and the sensor 108 faces the display transmission area 100b.

Alternatively, the sensor 108 comprises a fingerprint recognition sensor, a camera, a structured light sensor, a time-of-flight sensor, a distance sensor, a light sensor, etc., so that the sensor can collect signals through the display transmission area, so that the display device can realize under-screen sensing solutions such as under-screen fingerprint recognition, under-screen camera, under-screen facial recognition, and under-screen distance perception.

In addition, the display panel further comprises parts that are not shown, such as an encapsulation layer and touch electrodes.

Figure 3:
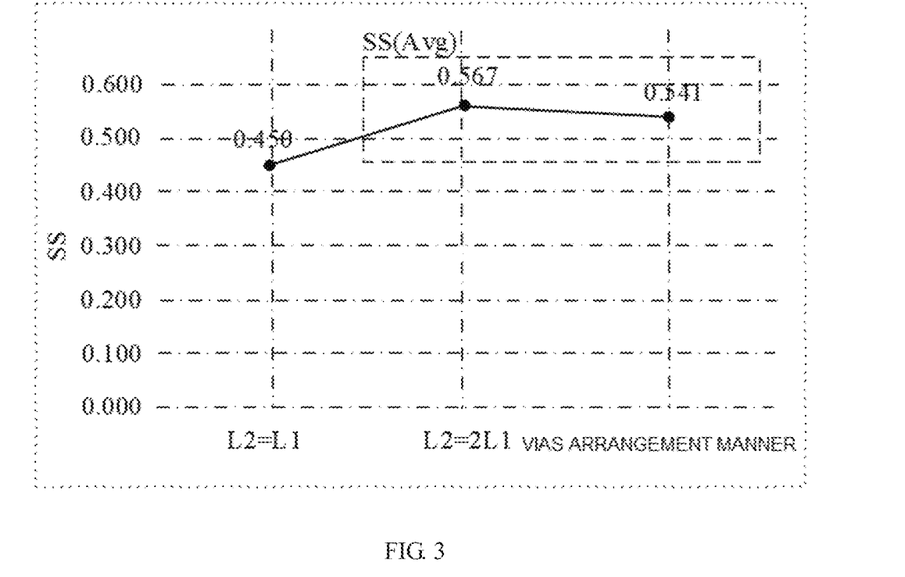
FIG. 3 is a simulation result diagram provided by an embodiment of the present disclosure.

As shown in FIG. 3, which is a simulation result diagram provided by an embodiment of the present disclosure. Taking the first sub-dummy holes 2011 located between two adjacent pixel circuit driving islands 110 as an example, after the display panel is defined with the plurality of first sub-dummy holes 2011 between two adjacent pixel circuit driving islands 110, the sub-threshold swings SS of the transistors 102 are increased, and the arrangement density of the first sub-dummy holes 2011 affects the sub-threshold swings of the transistors 102. Specifically, when the second length L2 is equal to the first length L1, the subthreshold swings SS of the transistors 102 are about 0.45; when the second length L2 is greater than or equal to two times the first length L1, the sub-threshold swings SS of the transistors 102 are about 0.567. When the plurality of first sub-dummy holes 2011 are arranged in a same manner as the arrangement of the plurality of vias 301a between two adjacent pixel circuit driving islands 110, the sub-threshold swings SS of the transistors 102 are about 0.541; that is, when the second length L2 is greater than or equal to two times the first length L1, the sub-threshold swings of the transistors 102 are relatively great, so that the sub-threshold swings SS of the transistors 102 in the transition display area 100a are similar to the sub-threshold swings of the main transistors 503 in the main display area 100c, which has a better effect on improving the electrical uniformity of the auxiliary pixel driving circuit 101, so the transition display area 100a and the main display area 100c can have similar display effects.

Figure 5:
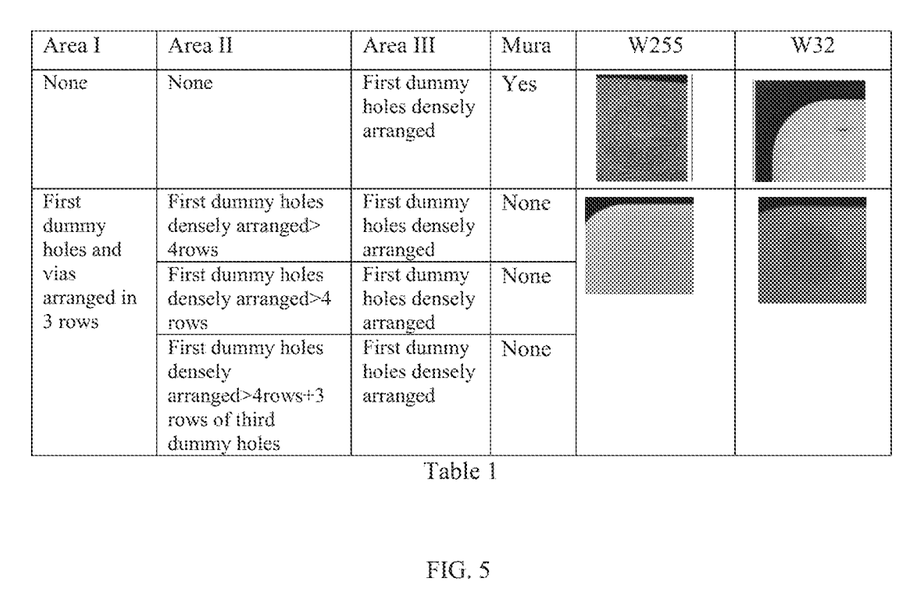
FIG. 5 is a result verification table for forming the dummy holes provided by an embodiment of the present disclosure.

Please refer to FIG. 5, which is a result verification table of forming dummy holes in an embodiment of the present disclosure.

It can be seen from FIG. 5 that on a side of the pixel circuit driving islands 110 close to the display transmission area 100b (i.e., area II), between two adjacent pixel circuit driving islands 110 (i.e., area I), and sides of the pixel circuit driving islands 110 close to the main display area 100c (i.e., area III) are defined with the plurality of dummy holes in the manner shown in FIGS. 2A-2C, which can prevent a problem of uneven display in the display transmission area 100b of the display panel. More specifically, the problem of the auxiliary sub-pixels 103 located in the display transmission area 100b being brighter with high gray levels and darker with low gray levels during display is prevented. Wherein, an arrangement manner of the dummy holes 200 as shown in FIG. 2B is a dense arrangement manner, and an arrangement manner of the dummy holes 200 as shown in FIGS. 2A and 2C is a via arrangement manner.

The embodiment of the present disclosure further provides a manufacture method of a display panel comprising a transition display area, and the manufacture method comprises the following steps:

Step S10: providing a substrate;

Step S20: forming an active layer and an insulation layer covering the active layer on the substrate;

Step S30: forming dummy holes.

Wherein, the dummy holes are located in the transition display area, and the dummy holes penetrate a part of the insulation layer away from the active layer. The display panel comprises a plurality of auxiliary pixel driving circuits located in the transition display area. Each of the auxiliary pixel driving circuits comprises transistors, and the transistors comprises the active layer.

Figure 4:
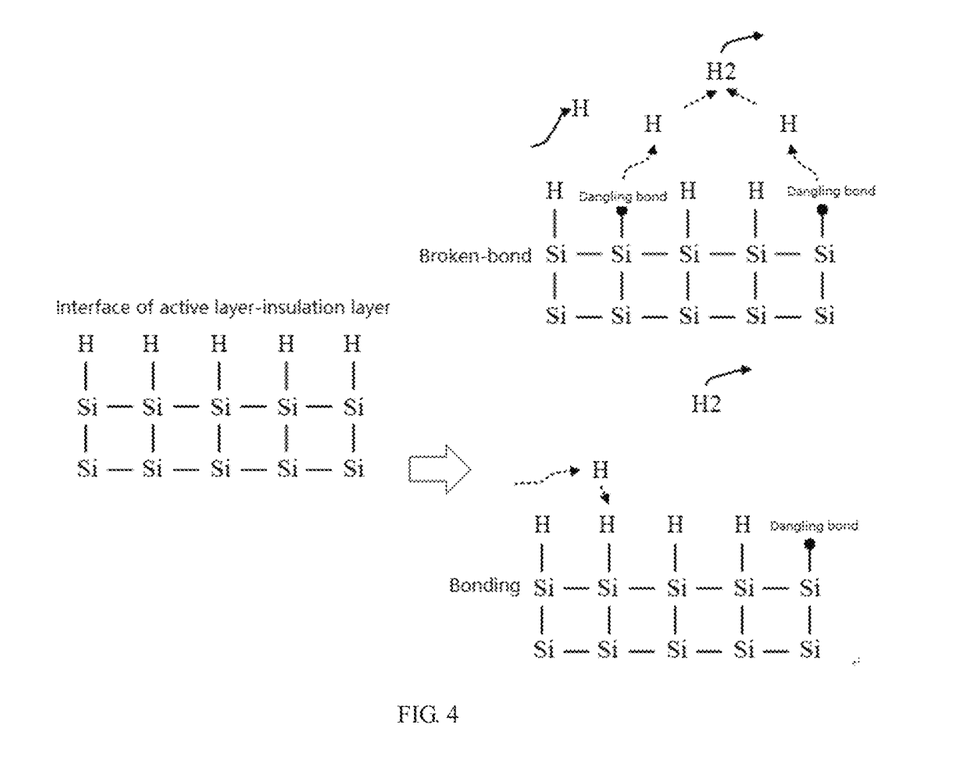
FIG. 4 is a principle diagram for forming the dummy holes to improve electrical properties of transistors provided by an embodiment of the present disclosure.

Alternatively, in order to make the dummy holes further improve the electrical uniformity of the auxiliary pixel driving circuit, after the step S30, the method further comprises a step S40: dehydrogenating the display panel. Please continue to refer to FIG. 4, which is a principle diagram of setting the dummy holes to improve the electrical properties of the transistors provided by the embodiment of the present disclosure. In the dehydrogenation treatment process, there are two mechanisms at the interface between the active layer and the insulation layer simultaneously. One is Si—H bonds being broken and Hs combining with $H_2$ to overflow; the other is free-state Hs and Si-dangling bonds combining to form bonds. A probability of occurrence of the first mechanism is greater than a probability of occurrence of the second mechanism. Therefore, an opening density of the dummy holes determines the concentration of the free-state Hs at the interface. The greater the opening density of the dummy holes, the faster the $H_2$ formed by the free-state Hs overflows, and the lower the probability of the second mechanism is, i.e., the lower the probability of the free state Hs combing with the Si-dangling bonds at the interface to form bonds. As a result, the defect density at the interface between the active layer and the insulation layer is increased, which in turn increases sub-threshold swings of the transistors and reduces sensitivity of current flowing through sources and drains of the transistors to fluctuations in gate-source voltages of the transistors, reducing influence of the fluctuations of the gate-source voltages of the transistors on the current flowing through the sources and drains of the transistors.

In addition, the insulation layer comprises a first insulation layer and a second insulation layer, and the step S20 further comprises:

Step S21: forming the first insulation layer covering the active layer;

Step S22: forming a first electrode layer, wherein the first electrode layer comprises a first wire portion and a first electrode portion facing the active layer;

Step S23: forming the second insulation layer covering the first electrode layer;

Wherein, the dummy holes penetrate parts of the first insulation layer and the second insulation layer not overlapping the active layer, the first electrode layer, and the second electrode layer.

In addition, after the step S23, the manufacturing method further comprises:

Step S24: forming a third electrode layer and a third insulation layer covering the third electrode layer.

Wherein, the dummy holes penetrate parts of the first insulation layer, the second insulation layer, and the third insulation layer not overlapping the active layer, the first electrode layer, and the second electrode layer.

In addition, after the step S30, the manufacturing method further comprises:

S50: forming a second electrode layer on the insulation layer, wherein the second electrode layer comprises a second wire portion and a second electrode portion electrically connected to the active layer;

S60: forming a planarization layer, wherein the planarization layer comprises a filling portion in the dummy holes;

Wherein the dummy holes penetrate parts of the insulation layer not overlapping the second electrode layer.

In addition, the manufacturing method further comprises a plurality of process steps such as forming auxiliary pixels and an encapsulation layer, which are not repeated here.

The embodiment of the present disclosure further comprises a display device comprising any of the above-mentioned display panel.

Further, the display device comprises a fixed terminal such as a TV or a desktop computer, a mobile terminal such as a mobile phone or a notebook computer, and a wearable device such as a bracelet, a virtual reality (VR) device, or an augmented reality (AR) device.

In the above-mentioned embodiments, the description of each embodiment has its own emphasis. For parts that are not described in detail in an embodiment, reference may be made to related descriptions of other embodiments. Specific examples are used in this article to illustrate the principles and implementations of the present disclosure. The descriptions of the above examples are only used to help understand the technical solutions and core ideas of the present disclosure; those of ordinary skill in the art should understand that: the technical solutions recorded in the foregoing embodiments are modified, or some of the technical features are equivalently replaced; these modifications or replacements do not cause the essence of the corresponding technical solutions to deviate from the scope of the technical solutions of the embodiments of the present disclosure.

What is claimed is:

1. A display panel, wherein the display panel comprises a display transmission area and a transition display area around the display transmission area, and the display panel comprises:

a plurality of auxiliary pixel driving circuits located in the transition display area, wherein each of the auxiliary pixel driving circuits comprises transistors, and each of the transistors comprises an active layer and an insulation layer located on the active layer; and a plurality of auxiliary sub-pixels located in the display transmission area, wherein the auxiliary sub-pixels are electrically connected to the auxiliary pixel driving circuits;

wherein the display panel is defined with first dummy holes in the transition display area, and the first dummy holes penetrate a part of the insulation layer away from the active layer.

2. The display panel of claim 1, wherein the display panel further comprises a plurality of pixel circuit driving islands located in the transition display area, wherein each of the pixel circuit driving islands comprises the auxiliary pixel driving circuits, the first dummy holes comprise a plurality of first sub-dummy holes, and each of the first sub-dummy holes is located between two adjacent pixel circuit driving islands.

3. The display panel of claim 2, wherein each of the pixel circuit driving islands has a length direction, each of the auxiliary pixel driving circuits has a first length in the length direction, and the first sub-dummy holes between two adjacent pixel circuit driving islands have a second length; wherein the second length is greater than the first length, the second length is equal to a distance between a first sub-dummy hole at a beginning end and a first sub-dummy hole at a terminal end in the length direction.

4. The display panel of claim 3, wherein the second length is greater than or equal to two times the first length.

5. The display panel of claim 2, wherein the first dummy holes comprise a plurality of second sub-dummy holes located at a side of the pixel circuit driving islands close to the display transmission area.

6. The display panel of claim 5, wherein a number of columns and/or rows of the second sub-dummy holes is greater than or equal to 4.

7. The display panel of claim 2, wherein the display panel further comprises a main display area located at a side of the transition display area away from the display transmission area, and the first dummy holes comprise a plurality of third sub-dummy holes located at a side of the pixel circuit driving islands close to the main display area.

8. The display panel of claim 7, wherein the display panel further comprises a plurality of main sub-pixels and a plurality of main pixel driving circuits driving the main sub-pixels in the main display area; wherein each of the main pixel driving circuits has a plurality of vias, and from a top view, an arrangement manner of the first dummy holes is same as an arrangement manner of the vias, or the first dummy holes is arranged in a matrix.

9. The display panel of claim 2, wherein the display panel is further defined with second dummy holes in the transition display area, the second dummy holes are located at sides of the pixel circuit driving islands close to the display transmission area, the second dummy holes penetrate the insulation layer, and an aperture diameter of the second dummy holes is greater than an aperture diameter of the first dummy holes.

10. The display panel of claim 9, wherein the display panel further comprises third dummy holes located in the transition display area, the third dummy holes penetrate the insulation layer, and a depth of the third dummy holes is greater than or equal to a depth of the first dummy holes.

11. The display panel of claim 1, wherein each of the transistors further comprises:
   a first insulation layer located on the active layer;
   a first electrode layer located on the first insulation layer, wherein the first electrode layer comprises a first wire portion and a first electrode portion facing the active layer;
   a second insulation layer located on the first electrode layer; and
   a second electrode layer located on the second insulation layer, wherein the second electrode layer comprises a second wire portion and a second electrode portion electrically connected to the active layer;
   wherein the insulation layer comprises the first insulation layer and the second insulation layer, and the first dummy holes do not penetrate the active layer, the first electrode layer, and the second electrode layer.

12. The display panel of claim 1, wherein the display panel further comprises a planarization layer at a side of the insulation layer away from the active layer, and the planarization layer comprises a filling portion located in the first dummy holes.

13. The display panel of claim 1, wherein an aperture diameter of the first dummy holes is greater than or equal to 2 um and less than or equal to 3.5 um, and a distance between two adjacent first dummy holes is greater than or equal to 2 um and less than or equal to 5 um.

14. The display panel of claim 9, wherein the aperture diameter of the second dummy holes is greater than or equal to 4 um and less than or equal to 7 um, and a difference between the aperture diameters of the second dummy holes and the first dummy holes is greater than or equal to 1 um and less than or equal to 4.5 um.

15. The display panel of claim 1, wherein the auxiliary sub-pixels comprise organic light-emitting diodes, micro light-emitting diodes, and sub-millimeter light-emitting diodes.

16. The display panel of claim 1, wherein the first dummy holes are prepared after dehydrogenation treatment.

17. A display device, wherein the display device comprises a display panel of claim 1.

* * * * *